(12) United States Patent
Li et al.

(10) Patent No.: US 10,748,983 B2
(45) Date of Patent: Aug. 18, 2020

(54) ORGANIC LIGHT-EMITTING DIODE DISPLAY PANEL

(71) Applicant: Wuhan China Star Optoelectronics Semiconductor Display Technology Co., Ltd., Wuhan (CN)

(72) Inventors: Chao Li, Wuhan (CN); Shijuan Yi, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 16/476,288

(22) PCT Filed: Dec. 20, 2018

(86) PCT No.: PCT/CN2018/122417
§ 371 (c)(1),
(2) Date: Jul. 7, 2019

(87) PCT Pub. No.: WO2020/098069
PCT Pub. Date: May 22, 2020

(65) Prior Publication Data
US 2020/0203460 A1    Jun. 25, 2020

(51) Int. Cl.
*H01L 27/32* (2006.01)
*G09G 3/3291* (2016.01)
*G09G 3/3266* (2016.01)

(52) U.S. Cl.
CPC ....... *H01L 27/3276* (2013.01); *G09G 3/3266* (2013.01); *G09G 3/3291* (2013.01); *H01L 27/3218* (2013.01); *H01L 27/3262* (2013.01)

(58) Field of Classification Search
CPC ............. H01L 27/3276; H01L 27/3218; H01L 27/3262; G09G 3/3266; G09G 3/3291
See application file for complete search history.

(56) References Cited

U.S. PATENT DOCUMENTS

| | | | | |
|---|---|---|---|---|
| 2002/0015110 A1* | 2/2002 | Brown Elliott | ...... | G09G 3/3614 348/589 |
| 2010/0079430 A1* | 4/2010 | Yamashita | ........... | G09G 3/3233 345/210 |
| 2015/0090988 A1* | 4/2015 | Oooka | ................ | H01L 27/3265 257/40 |
| 2015/0371589 A1* | 12/2015 | Kim | .................... | H01L 27/1229 345/208 |
| 2016/0041668 A1* | 2/2016 | Chaji | .................... | G06F 3/0416 345/174 |
| 2016/0240593 A1* | 8/2016 | Gu | ....................... | G09G 3/3225 |

* cited by examiner

*Primary Examiner* — Timor Karimy

(57) ABSTRACT

An organic light-emitting diode (OLED) display device includes a first pixel column, a second pixel column, a third pixel column, a fourth pixel column, and an outputting unit circuit comprising a first outputting signal line, a second outputting signal line, and a third outputting signal line. The first outputting signal line is connected to the first pixel column. The second outputting signal line is connected to the third pixel column. The third outputting signal line is connected to the second pixel column and the fourth pixel column.

10 Claims, 3 Drawing Sheets

ORGANIC LIGHT-EMITTING DIODE DISPLAY PANEL

RELATED APPLICATIONS

This application is a National Phase of PCT Patent Application No. PCT/CN2018/122417 having International filing date of Dec. 20, 2018, which claims the benefit of priority of Chinese Patent Application No. 201811352671.9 filed on Nov. 14, 2018. The contents of the above applications are all incorporated by reference as if fully set forth herein in their entirety.

FIELD AND BACKGROUND OF THE INVENTION

The present disclosure relates to display technology, and more particularly, to an organic light-emitting diode (OLED) display device.

Currently, an active-matrix organic light-emitting diode (AMOLED) has a characteristic of self-luminescence. The AMOLED adopts a very thin coating of organic material and a glass cover. When an electric current flows by, the organic material emits light. Advantages of an AMOLED panel are wide viewing angles, high color saturation, low driving voltage, and low power consumption, coupled with fast response, light weight, thinness, simple structure, and low cost, so the AMOLED panel is regarded as one of the most promising products.

As for the AMOLED design of the related art, a unit test circuit adopts a plurality of thin-film transistors (TFTs) and a plurality of signal lines. The design of the unit test circuit is sophisticated and occupies more space, further reducing the screen-to-body ratio of the AMOLED.

SUMMARY OF THE INVENTION

The present disclosure proposes an organic light-emitting diode (OLED) display device. Compared with the OLED display panel of the related art where a plurality of thin-film transistors (TFTs) and a plurality of signal lines are adopted, further affecting the screen-to-body ratio, the number of unit test inputting signal lines in a pixel driving circuit are reduced in the present disclosure.

According to an embodiment of the present disclosure, an organic light-emitting diode (OLED) display device includes a data signal line, a scanning signal line, a pixel array, an inputting unit circuit, a controlling unit circuit, and an outputting unit circuit. The pixel array includes a first pixel column, a second pixel column, a third pixel column, and a fourth pixel column distributed in a matrix in a first direction. The first pixel column, the second pixel column, the third pixel column, and the fourth pixel column are arranged periodically in the first direction. The inputting unit circuit includes a first inputting signal line, a second inputting signal line, and a third inputting signal line. The controlling unit circuit includes a first thin-film transistor (TFT), a second TFT, a third TFT, and a first controlling signal line. The first controlling signal line is connected to a first controlling terminal of the first TFT, a second controlling terminal of the second TFT, and a third controlling terminal of the third TFT. The first inputting signal line, the second inputting signal line, and the third inputting signal line are connected to a first inputting terminal of the first TFT, a second inputting terminal of the second TFT, and a third inputting terminal of the third TFT, respectively. The outputting unit circuit includes a first outputting signal line, a second outputting signal line, and a third outputting signal line. The first outputting signal line, the second outputting signal line, and the third outputting signal line are connected to a first outputting terminal of the first TFT, a second outputting terminal of the second TFT, a third outputting terminal of the TFT, respectively. The first outputting signal line is connected to the first pixel column. The second outputting signal line is connected to the third pixel column. The third outputting signal line is connected to the second pixel column and the fourth pixel column.

According to an embodiment of the present disclosure, the first pixel column and the third pixel column both comprises a red subpixel and a blue subpixel; the red subpixels and the blue subpixels are arranged alternately. The red subpixel in the first pixel column and the red subpixel in the third pixel column are arranged staggeredly. The blue subpixel in the first pixel column and the blue subpixel in the third pixel column are arranged staggeredly. The second pixel column and the fourth pixel column comprise a green subpixel only.

According to an embodiment of the present disclosure, the first clock signal is input to the first pixel column through the first outputting signal line when a red image is shown the OLED display panel. The second clock signal is input to a third pixel column through the second outputting signal line when the red image is shown the OLED display panel.

According to an embodiment of the present disclosure, a high voltage level of the first clock signal and a high voltage level of the second clock signal are outputted alternately.

According to an embodiment of the present disclosure, a high voltage level of the first clock signal is greater than a supply voltage imposed on the OLED display panel. A high voltage level of the second clock signal is greater than the supply voltage imposed on the OLED display panel.

According to an embodiment of the present disclosure, the third controlling terminal of the third TFT is turned off when a red image is shown on the OLED display panel.

According to an embodiment of the present disclosure, a third clock signal is input to the first pixel column through the first outputting signal line when a blue image is shown on the OLED display panel. A fourth clock signal is input to the third pixel column through the second outputting signal line when the blue image is shown on the OLED display panel.

According to an embodiment of the present disclosure, a high voltage level of the third clock signal and a high voltage level of the fourth clock signal are outputted alternately.

According to an embodiment of the present disclosure, a high voltage level of the third clock signal is greater than a supply voltage imposed on the OLED display panel. A high voltage level of the fourth clock signal is greater than the supply voltage imposed on the OLED display panel.

According to an embodiment of the present disclosure, the third controlling terminal of the third TFT is turned on when a green image is shown on the OLED display panel.

The present disclosure brings a benefit as described below: The present disclosure provides an OLED display panel. A set of six unit testing signal lines are reduced to a set of four, and thus can be configured to detect an image formed by a red subpixel, a green subpixel, a blue subpixel and shown on the OLED display panel, further increasing the screen-to-body ratio of the OLED display panel.

BRIEF DESCRIPTION OF THE SEVERAL VIEWS OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF SPECIFIC EMBODIMENTS OF THE INVENTION

In the disclosure, it is should be understood that spatially relative terms, such as "center", "longitudinal", "lateral", "length", "width", "above", "below", "front", "back", "left", "right", "horizontal", "vertical", "top", "bottom", "inner", "outer", "clockwise", "counterclockwise", "axial", "radial", "circumferential", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The spatially relative terms are not limited to specific orientations depicted in the figures.

An organic light-emitting diode (OLED) display panel of the related art includes a unit test circuit, and the unit test circuit includes a plurality of thin-film transistors (TFTs) and a plurality of signal lines. The design of the unit test circuit is sophisticated and occupies a lot of space, further decreasing the screen-to-body ratio of the OLED display panel. The present disclosure proposes an organic light-emitting diode (OLED) display device to amend the defects existing in the related art.

Figure 1:
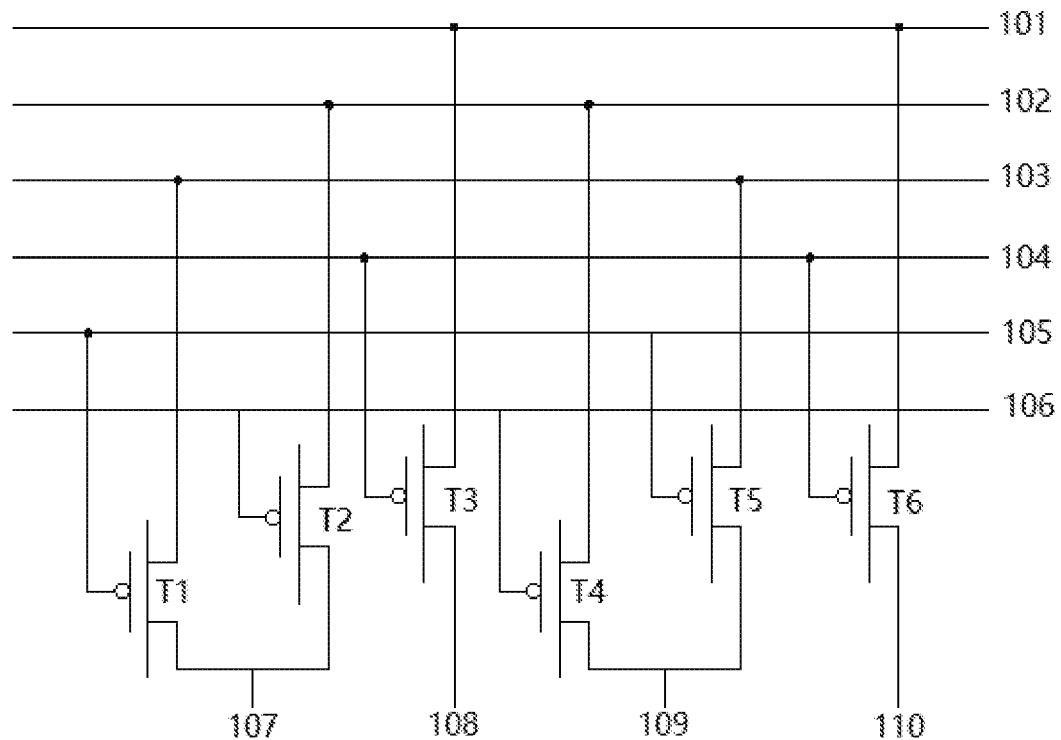
FIG. 1 illustrates the design of a unit test circuit of an OLED display panel of the related art.

FIG. 1 illustrates the design of a unit test circuit of an OLED display panel of the related art. The unit testing signal line 101 inputs a signal to a green OLED light-emitting layer on the first row of the light-emitting layer in a display area. The unit testing signal line 102 inputs a signal to a blue or red OLED light-emitting layer on the first row of the light-emitting layer in the display area. The unit testing signal line 103 inputs a signal to the blue or red OLED light-emitting layer on the first row of the light-emitting layer in the display area. The switch controlling signal line 104 controls the TFT T3 and the TFT T6. The switch controlling signal line 105 controls the TFT T1 and the TFT T5. The switch controlling signal line 106 controls the TFT T2 and the TFT T4. The data signal line 107 outputs a signal to the blue or red OLED light-emitting layer on the first row of the light-emitting layer in the display area. A signal is input to the green OLED light-emitting layer on the first row of the light-emitting layer in the display area through the data signal line 108. A signal is input to the blue or red OLED light-emitting layer on the first row of the light-emitting layer in the display area through the data signal line 109. A signal is input to the green OLED light-emitting layer on the first row of the light-emitting layer in the display area through the data signal line 110.

The working principle of the OLED display panel of the related art (for example, in a full red image): A low voltage-level data signal is input through the unit testing signal line 103. A high voltage-level data signal is input through the unit testing signal line 101 and the unit testing signal line 102. A low voltage-level data signal is input through the switch controlling signal line 105. A high voltage-level data signal is input through the switch controlling signal line 104 and the switch controlling signal line 106. At this time, the TFT T1 and the TFT T5 are both turned on, and the TFT T2, the TFT T3, the TFT T4, and the TFT T6 are all turned off. In the end, the light-emitting layer on the first row in the pixel area as a red OLED light-emitting layer emits light while the OLED light-emitting layers with other colors do not emit light. The clock signals, which are high voltage-level and high voltage-level signals alternate, are input through the switch controlling signal line 105, the switch controlling signal line 104, and the switch controlling signal line 106 so the low voltage-level signal is input through the switch controlling signal line 106 and the high voltage-level signal is input through the switch controlling signal line 105 when the signal is transmitted to the second row. At this time, the TFT T2 and the TFT T4 are both turned on; the TFT T1, the TFT T3, the TFT T5, and the TFT T6 are all turned off. The low voltage-level signal is input through the unit testing signal line 103, and the high voltage-level signal is input through the unit testing signal line 101 and the unit testing signal line 102, which remains unchanged. The red OLED light-emitting layer on the second row of the light-emitting layer in the pixel area emits light while the OLED light-emitting layers with the rest colors do not emit light. Since red/green/blue (R/G/B) in the pixel area are arranged on the first row of R, G, B, and G arranged periodically and on the second row of B, G, R, and G arranged periodically, odd-numbered rows arranged in the first row is repeated and even-numbered rows arranged in the second row is repeated. Therefore, red light can be emitted layer by layer in the OLED display panel of the related art.

The unit test circuit adopted by OLED display panel of the related art is designed to include a plurality of TFTs and six signal lines, which is very sophisticated. As a result, the screen-to-body ratio of OLED display panel is greatly reduced.

Figure 2A:
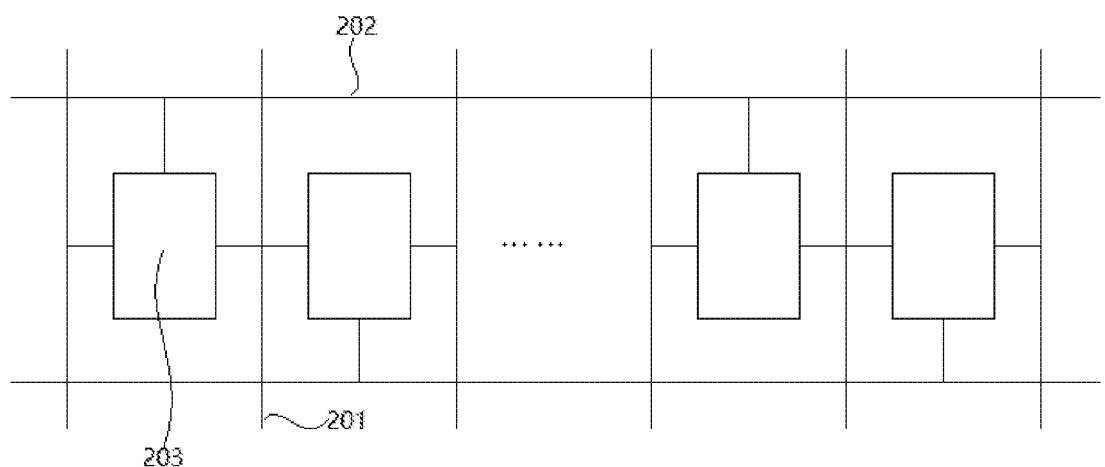
FIG. 2a illustrates a schematic diagram of an OLED display panel according to an embodiment of the present disclosure.
Figure 2B:
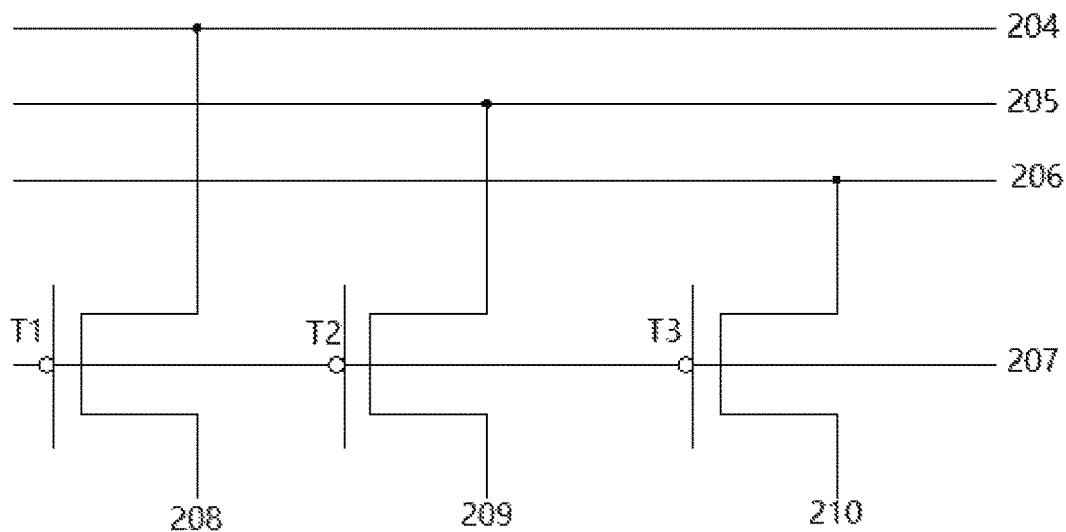
FIG. 2b illustrates a circuit diagram of a unit test circuit applied in the OLED display panel according to an embodiment of the present disclosure.
Figure 2C:
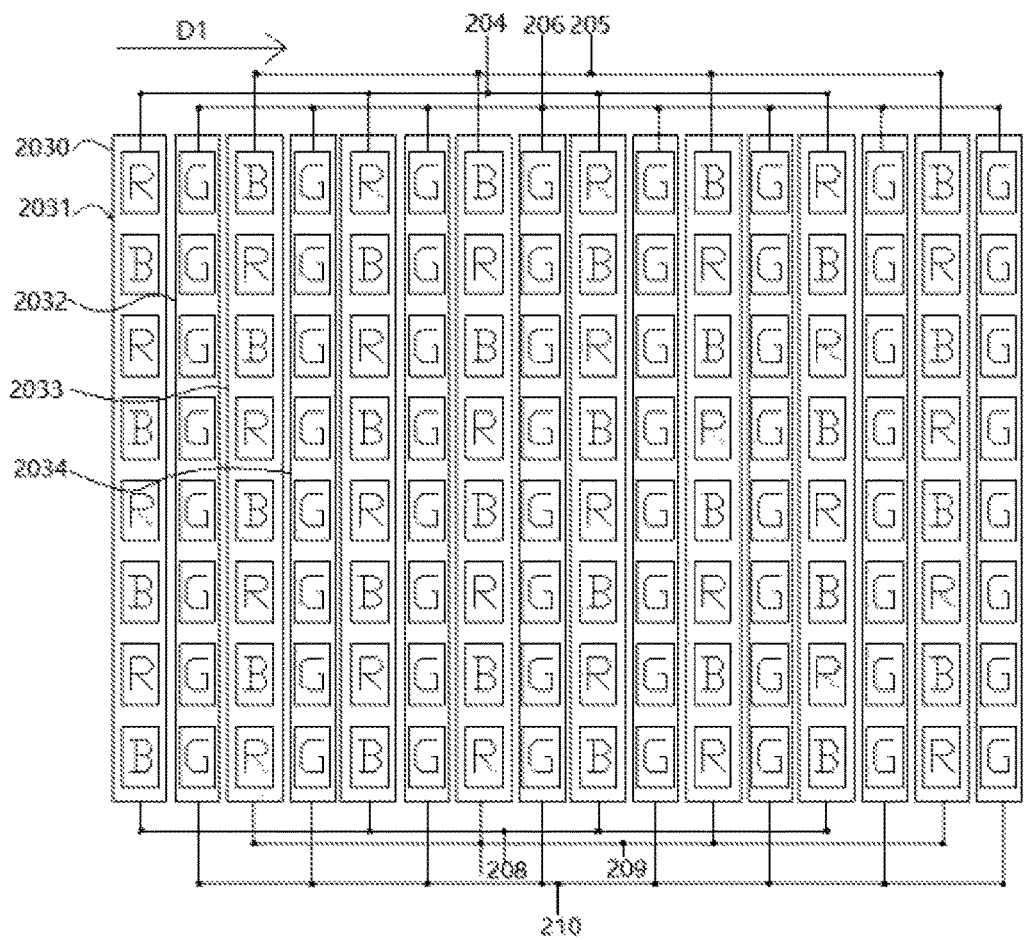
FIG. 2c illustrates a schematic diagram of a pixel array applied in the OLED display panel according to an embodiment of the present disclosure.

As FIG. 2a, FIG. 2b, and FIG. 2c illustrate, the OLED display panel proposed by the present disclosure includes a data signal line 201 and a scanning signal line 202.

The pixel 203 is arranged between the data signal line 201 and the scanning signal line 202.

A pixel array 2030 includes a first pixel column 2031, a second pixel column 2032, a third pixel column 2033, and a fourth pixel column 2034 distributed in a matrix in a first direction D1. Combinations of the first pixel column 2031, the second pixel column 2032, the third pixel column 2033, and the fourth pixel column 2034 are arranged periodically in the first direction D1.

The inputting unit circuit includes a first inputting signal line 204, a second inputting signal line 205, and a third inputting signal line 206. The first inputting signal line 204 is connected to the first pixel column 2031. The second inputting signal line 205 is connected to the third pixel column 2033. The third inputting signal line 206 is connected to the second pixel column 2032 and the fourth pixel column 2034.

The controlling unit circuit includes a first TFT T1, a second TFT T2, a third TFT T3, and a first controlling signal line 207. A first controlling signal line 207 is connected to a first controlling terminal of the first TFT T1, a second controlling terminal of the second TFT T2, and a third controlling terminal of the third TFT T3. A first inputting signal line 204, a second inputting signal line 205, and a third inputting signal line 206 are connected to a first inputting terminal of the first TFT T1, a second inputting terminal of the second TFT T2, and a third inputting terminal of a third TFT T3, respectively.

An outputting unit circuit includes a first outputting signal line 208, a second outputting signal line 209, and a third outputting signal line 210. The first outputting signal line 208, the second outputting signal line 209, and the third outputting signal line 210 are connected to a first outputting terminal of the first TFT T1, a second outputting terminal of the second TFT T2, a third outputting terminal of the TFT T3, respectively.

The first outputting signal line 208 is connected to the first pixel column 2031. The second outputting signal line 209 is connected to the third pixel column 2033. The third outputting signal line 210 is connected to the second pixel column 2032 and the fourth pixel column 2034.

In another embodiment, a first pixel column 2031 and a third pixel column 2033 both include a red subpixel and a blue subpixel. The red subpixel and the blue subpixel are arranged alternately. The red subpixel in the first pixel column 2031 and the red subpixel in the third pixel column 2033 are arranged staggeredly. The blue subpixel in the first pixel column 2031 and the blue subpixel in the third pixel column 2033 are arranged staggeredly. A second pixel column 2032 and a fourth pixel column 2034 include a green subpixel only.

In another embodiment, when a red image is shown on an organic light-emitting diode (OLED) display panel, a first clock signal is input to a first pixel column 2031 through a first outputting signal line 208. A second clock signal is input to a third pixel column 2033 through a second outputting signal line 209. The first clock signal and the second clock signal are inverted. The high voltage level of the first clock signal and the high voltage level of the second clock signal both are greater than the supply voltage imposed on the OLED display panel.

In another embodiment, when a red image is shown on an organic light-emitting diode (OLED) display panel, a third controlling terminal of a third thin-film transistor (TFT) T3 is turned off.

In another embodiment, when a blue image is shown on an organic light-emitting diode (OLED) display panel, a third clock signal is input to a first pixel column 2031 through a first outputting signal line 208. A fourth clock signal is input to a third pixel column 2033 through a second outputting signal line 209. The third clock signal and the fourth clock signal are inverted. The high voltage level of the third clock signal and the high voltage level of the fourth clock signal both are greater than the supply voltage imposed on the OLED display panel.

In another embodiment, a third controlling terminal of a third thin-film transistor (TFT) is turned on when a green image is shown on an organic light-emitting diode (OLED) display panel.

The operating principle of the OLED display panel is detailed by using a full red image as an example.

When the scanning signal starts to scan a subpixel circuit on the first row, a signal is input to a light-emitting layer on a first row, which is a red pixel circuit, through the first inputting signal line 204. A signal is input to a light-emitting layer on the first row, which is a blue pixel circuit, through the second inputting signal line 205. A signal is input to a light-emitting layer on the first row, which is a green pixel circuit, through the third inputting signal line 206. When the light-emitting layer emits the red light, a low voltage-level data signal is input to the first inputting signal line 204, and a high voltage-level data signal is input to a second inputting signal line 205 and a third inputting signal line 206. Moreover, the high voltage-level signal is greater than the operating voltage of a pixel driving circuit, so the blue subpixel circuit which the second inputting signal line 205 is connected to and the green subpixel circuit which the third inputting signal line 206 is connected to is connected are not turned on. Because the signal is input to the light-emitting layer on the first row, which is a red pixel circuit, through the first inputting signal line 204, the light-emitting layer on the first row in the pixel area as a red OLED light-emitting layer emits light while the other OLED light-emitting layers which emit colors except red do not emit light.

The red subpixel, the green subpixel, the blue subpixel in the pixel 203 are arranged as the first row of the red subpixel, the green subpixel, and the blue subpixel, which are arranged periodically. The second row of the blue subpixel, the green subpixel, and the red subpixel are arranged periodically. Odd-numbered rows are arranged like the first row. Even-numbered rows are arranged like the second row. A signal input to the subpixels is a clock signal at a high voltage level and a low voltage level alternating.

When the scanning signal starts to scan the second row of subpixel circuit, a signal is input to a light-emitting layer on a second row, which is a blue pixel circuit, through the first inputting signal line 204. A signal is input to a light-emitting layer on a second row, which is a red pixel circuit, through the second inputting signal line 205. A signal is input to a light-emitting layer on a second row, which is a green pixel circuit, through the third inputting signal line 206. A high voltage-level data signal is input through the first inputting signal line 204. The high voltage-level signal is greater than the operating voltage of the pixel driving circuit. So the blue subpixel circuit, which is in the light-emitting layer on the second row in the display area of the OLED display panel and the first inputting signal line 204 is connected to is not turned on. A low voltage-level data signal is input through the second inputting signal line 205. The red subpixel circuit, which is in the light-emitting layer on the second row in the display area of the OLED display panel and the second inputting signal line 205 is connected to is turned on. A high voltage-level data signal is input through the third inputting signal line 206. The high voltage-level signal is greater than the operating voltage of the pixel driving circuit. The green subpixel circuit, which is in the light-emitting layer on the second row in the display area of the OLED display panel and the third inputting signal line 206 is connected to is not turned on. Therefore, a red OLED light-emitting layer on the second row of the light-emitting layer in the pixel area emits light while the OLED light-emitting layers with the colors except red do not emit light.

A repetitive scanning signal on an add row starts to scan the subpixel circuit on the first row. A repetitive scanning signal starts to scan the subpixel circuit on the second row. The layers of the OLED display panel emits the red light one by one successfully. Compared with the display effect of a general OLED display panel detected with a unit test, the display effect of the OLED display panel proposed by the present disclosure shows almost no difference.

Figure 3:
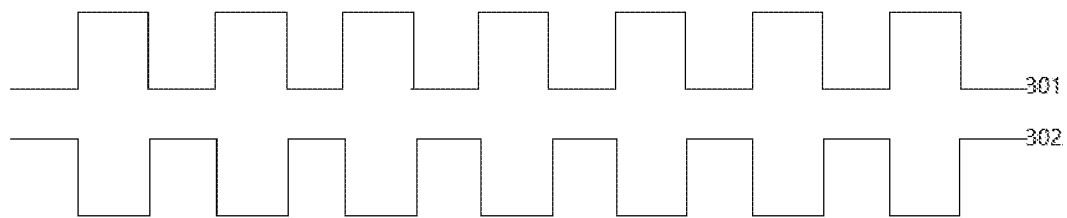
FIG. 3 illustrates a waveform of a clock signal applied in the unit test circuit when showing a red image.

As FIG. 3 illustrates, the digital signal 301 and the digital signal 302 are mutually inverted and input through the unit test inputting signal line as FIG. 2b illustrates. The data signal 301 and data signal 302 are input to the red and blue light-emitting layers on the first row, respectively. When a red image is shown on the OLED display panel, an alternating clock signal is input to the OLED display panel. The high voltage level of the input data signal must be greater than the operating voltage imposed on the pixel driving circuit, which ensures that the OLED light-emitting layer on the pixels does not emit light when the high voltage-level data signal is input. In this way, only a red image is shown on the OLED display panel.

The present disclosure provides a unit test to detect image display with the blue light only. Only the OLED light-emitting layers which emit blue light only emit light. Compared with the display effect of the blue image shown on the OLED display panel of the related art, the display effect of the blue image shown on the OLED display panel proposed by the present disclosure shows almost no difference.

Figure 4:
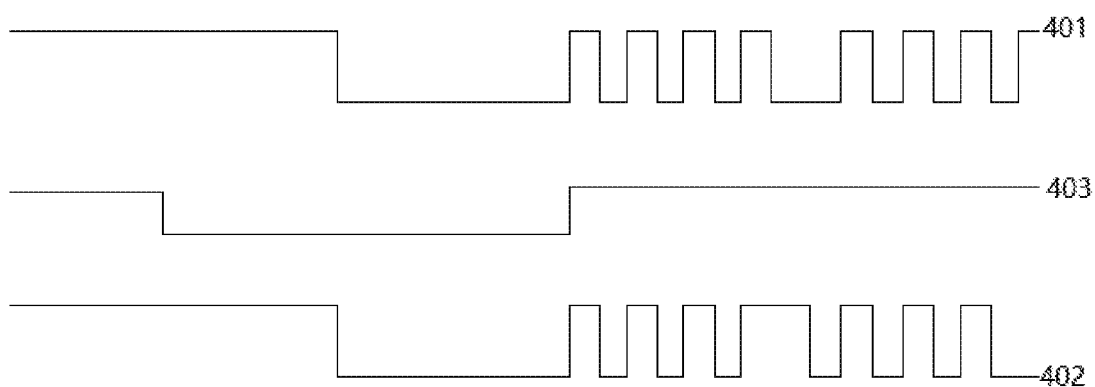
FIG. 4 illustrates a waveform of a clock signal applied in the unit test circuit when showing a colorful image.

As FIG. 4 illustrates, when the pixel driving circuit proposed by the present disclosure detects a colorful image, the data signals 401, 402, and 403 are input to the red, blue, and green OLED light-emitting layers on the first row in the display area, respectively, through the unit test inputting signal line. Compared with the display effect of the colorful images shown on the OLED display panel of the related art, the display effect of the colorful images shown on the OLED display panel proposed by the present disclosure shows almost no difference.

The present disclosure brings a benefit as described below: The present disclosure provides an OLED display panel. A set of six unit testing signal lines are reduced to a set of four, and thus can be configured to detect an image formed by a red subpixel, a green subpixel, a blue subpixel and shown on the OLED display panel, further increasing the screen-to-body ratio of the OLED display panel.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

What is claimed is:

1. An organic light-emitting diode (OLED) display device, comprising:
    a data signal line;
    a scanning signal line;
    a pixel array, comprising a first pixel column, a second pixel column, a third pixel column, and a fourth pixel column distributed in a matrix in a first direction; the first pixel column, the second pixel column, the third pixel column, and the fourth pixel column being arranged periodically in the first direction;
    an inputting unit circuit, comprising a first inputting signal line, a second inputting signal line, and a third inputting signal line;
    a controlling unit circuit, comprising a first thin-film transistor (TFT), a second TFT, a third TFT, and a first controlling signal line; the first controlling signal line being connected to a first controlling terminal of the first TFT, a second controlling terminal of the second TFT, and a third controlling terminal of the third TFT; the first inputting signal line, the second inputting signal line, and the third inputting signal line being connected to a first inputting terminal of the first TFT, a second inputting terminal of the second TFT, and a third inputting terminal of the third TFT, respectively;
    an outputting unit circuit, comprising a first outputting signal line, a second outputting signal line, and a third outputting signal line; the first outputting signal line, the second outputting signal line, and the third outputting signal line being connected to a first outputting terminal of the first TFT, a second outputting terminal of the second TFT, a third outputting terminal of the TFT, respectively;
    wherein the first outputting signal line is connected to the first pixel column; the second outputting signal line is connected to the third pixel column; the third outputting signal line is connected to the second pixel column and the fourth pixel column.

2. The OLED display device of claim 1, wherein the first pixel column and the third pixel column both comprises a red subpixel and a blue subpixel; the red subpixels and the blue subpixels are arranged alternately;
    the red subpixel in the first pixel column and the red subpixel in the third pixel column are arranged staggeredly; the blue subpixel in the first pixel column and the blue subpixel in the third pixel column are arranged staggeredly;
    the second pixel column and the fourth pixel column comprise a green subpixel only.

3. The OLED display device of claim 2, wherein the first clock signal is input to the first pixel column through the first outputting signal line when a red image is shown the OLED display panel;
    the second clock signal is input to a third pixel column through the second outputting signal line when the red image is shown the OLED display panel.

4. The OLED display device of claim 3, wherein a high voltage level of the first clock signal and a high voltage level of the second clock signal are outputted alternately.

5. The OLED display device of claim 3, wherein a high voltage level of the first clock signal is greater than a supply voltage imposed on the OLED display panel;
    a high voltage level of the second clock signal is greater than the supply voltage imposed on the OLED display panel.

6. The OLED display device of claim 2, wherein the third controlling terminal of the third TFT is turned off when a red image is shown on the OLED display panel.

7. The OLED display device of claim 2, wherein a third clock signal is input to the first pixel column through the first outputting signal line when a blue image is shown on the OLED display panel;
    a fourth clock signal is input to the third pixel column through the second outputting signal line when the blue image is shown on the OLED display panel.

8. The OLED display device of claim 7, wherein a high voltage level of the third clock signal and a high voltage level of the fourth clock signal are outputted alternately.

9. The OLED display device of claim 7, wherein a high voltage level of the third clock signal is greater than a supply voltage imposed on the OLED display panel;
    a high voltage level of the fourth clock signal is greater than the supply voltage imposed on the OLED display panel.

10. The OLED display device of claim 2, wherein the third controlling terminal of the third TFT is turned on when a green image is shown on the OLED display panel.

* * * * *

UNITED STATES PATENT AND TRADEMARK OFFICE
CERTIFICATE OF CORRECTION

Page 1 of 1

PATENT NO. : 10,748,983 B2
APPLICATION NO. : 16/476288
DATED : August 18, 2020
INVENTOR(S) : Chao Li et al.

It is certified that error appears in the above-identified patent and that said Letters Patent is hereby corrected as shown below:

On the Title Page

Insert the following:
-- (30) *Foreign Application Priority Data*
Nov. 14, 2018 (CN)................. 201811352671.9 --

Signed and Sealed this
Twenty-second Day of December, 2020

Andrei Iancu
*Director of the United States Patent and Trademark Office*